(12) United States Patent
Szmanda

(10) Patent No.: US 6,855,475 B2
(45) Date of Patent: Feb. 15, 2005

(54) PHOTORESIST COMPOSITION

(75) Inventor: Charles R. Szmanda, Westborough, MA (US)

(73) Assignee: Shipley Company, L.L.C., Marlborough, MA (US)

( * ) Notice: Subject to any disclaimer, the term of this patent is extended or adjusted under 35 U.S.C. 154(b) by 203 days.

(21) Appl. No.: 10/101,103

(22) Filed: Mar. 19, 2002

(65) Prior Publication Data

US 2003/0027076 A1 Feb. 6, 2003

Related U.S. Application Data

(60) Provisional application No. 60/277,874, filed on Mar. 22, 2001.

(51) Int. Cl.$^7$ .............................................. G03F 7/004
(52) U.S. Cl. .................... 430/270.1; 430/326; 430/905; 430/907
(58) Field of Search ............................. 430/270.1, 326, 430/905, 907

(56) References Cited

U.S. PATENT DOCUMENTS

| | | | |
|---|---|---|---|
| 6,057,083 A | 5/2000 | Taylor et al. | |
| 6,136,501 A | 10/2000 | Trefonas, III et al. | |
| 6,200,725 B1 | 3/2001 | Takechi et al. | |
| 6,379,861 B1 | 4/2002 | Trefonas, III et al. | |
| 6,579,658 B2 * | 6/2003 | Hatakeyama et al. | 430/270.1 |
| 6,599,577 B2 | 7/2003 | Zhao | |
| 2001/0018162 A1 | 8/2001 | Hatakeyama et al. | |
| 2001/0038969 A1 | 11/2001 | Hatakeyama et al. | |
| 2002/0055060 A1 | 5/2002 | Taylor et al. | |
| 2002/0058199 A1 | 5/2002 | Zampini et al. | |
| 2002/0160302 A1 | 10/2002 | Szmanda et al. | |
| 2002/0173680 A1 | 11/2002 | Szmanda et al. | |
| 2003/0082477 A1 | 5/2003 | Szmanda et al. | |
| 2003/0211422 A1 * | 11/2003 | Yip et al. | 430/296 |

FOREIGN PATENT DOCUMENTS

| | | |
|---|---|---|
| DE | 42 07 261 C2 | 3/1992 |
| DE | 42 07 263 A1 | 3/1992 |
| EP | 0 789 278 A2 | 8/1997 |
| EP | 0 935 172 | 8/1999 |
| EP | 1 035 441 | 9/2000 |
| EP | 1 091 249 | 4/2001 |
| EP | 1 148 388 | 4/2001 |
| WO | WO 00/17712 | 3/2000 |
| WO | WO 01/74916 | 10/2001 |
| WO | WO 02/21212 | 3/2002 |
| WO | WO 02/21213 | 3/2002 |

OTHER PUBLICATIONS

Ito et al., "Polymer design for 157 nm chemically amplified resists", Advances in Resist Technology and Processing XVIII; Santa Clara, CA, U.S., Feb. 26–28, 2001; vol. 4345, No. I, 2001, pp. 273–284, XP002209442; Proc. SPIE Int. Soc. Opt Eng; Proceeings of SPIE—The International Society for Optical Engineering 2001.

Itani et al., "Characterization of Fluoropolymers for 157nm Chemically Amplified Resist", J. Vac Sci Technol B Microelectron Nanometer Struct; Journal of Vacuum Science and Technology B: Microelectronics and Nanometer Structures Nov./Dec. 2001, vol. 19, No. 6, Nov. 2001, pp. 2705–2708, XP002209443.

* cited by examiner

Primary Examiner—Rosemary Ashton
(74) Attorney, Agent, or Firm—Peter F. Corless; Darryl P. Frickey; Edwards & Angell, LLP

(57) ABSTRACT

Disclosed are photoresist compositions suitable for imaging with sub 200 nm wavelength radiation including as polymerized units one or more monomers having an electronegative substituent and an ester group containing certain leaving groups. Also disclosed are methods of providing photoresist relief images using the photoresist compositions.

24 Claims, No Drawings

PHOTORESIST COMPOSITION

The present application claims the benefit of U.S. provisional application No. 60/277,874, filed Mar. 22, 2001, which is incorporated herein by reference in its entirety.

BACKGROUND OF THE INVENTION

The present invention relates generally to the field of photoresists. In particular, the present invention relates to the field of chemically amplified positive-acting photoresists.

Photoresists are photosensitive films used for transfer of images to a substrate. A coating layer of a photoresist is formed on a substrate and the photoresist layer is then exposed through a photomask to a source of activating radiation. The photomask has areas that are opaque to activating radiation and other areas that are transparent to activating radiation. Exposure to activating radiation provides a photoinduced chemical transformation of the photoresist coating to thereby transfer the pattern of the photomask to the photoresist-coated substrate. Following exposure, the photoresist is developed to provide a relief image that permits selective processing of a substrate.

A photoresist can be either positive-acting or negative-acting. For most negative-acting photoresists, those coating layer portions that are exposed to activating radiation polymerize or crosslink in a reaction between a photoactive compound and polymerizable agents of the photoresist composition. Consequently, the exposed coating portions are rendered less soluble in a developer solution than unexposed portions. For positive-acting photoresists, exposed portions are rendered more soluble in a developer solution while areas not exposed remain comparatively less developer soluble. In general, photoresist compositions include at least a resin binder component and a photoactive agent.

More recently, chemically-amplified type resists have been increasingly employed, particularly for formation of sub-micron images and other high performance applications. Such photoresists may be negative-acting or positive-acting and generally include many crosslinking events (in the case of a negative-acting resist) or deprotection reactions (in the case of a positive-acting resist) per unit of photogenerated acid. In the case of positive chemically-amplified resists, certain cationic photoinitiators have been used to induce cleavage of certain "blocking" groups pendant from a photoresist binder, or cleavage of certain groups comprising a photoresist binder backbone. See, for example, U.S. Pat. Nos. 5,075,199; 4,968,581; 4,810,613; and 4,491,628 and Canadian Patent Application No. CA 2,001,384. Upon cleavage of the blocking group through exposure of a coating layer of such a resist, a polar functional group is formed, e.g. carboxyl or imide, which results in different solubility characteristics in exposed and unexposed areas of the resist coating layer. See also R. D. Allen et al. *Proceedings of SPIE*, 2724:334–343 (1996); and P. Trefonas et al. *Proceedings of the 11th International Conference on Photopolymers* (*Soc. of Plastics Engineers*), pp 44–58 (Oct. 6, 1997).

While currently available photoresists are suitable for many applications, current resists can also exhibit significant shortcomings, particularly in high performance applications such as formation of highly resolved sub-half micron and sub-quarter micron features.

Consequently, interest has increased in photoresists that can be photoimaged with short wavelength radiation, including exposure radiation of about 250 nm or less, or even about 200 nm or less, and particularly for sub 160 nm wavelengths, particularly 157 nm. Use of such short exposure wavelengths can enable formation of smaller features. Accordingly, a photoresist that yields well-resolved images upon sub 160 nm exposure could enable formation of extremely small (e.g. sub-quarter micron) features that respond to constant industry demands for smaller dimension circuit patterns, e.g. to provide greater circuit density and enhanced device performance.

However, many current photoresists are generally designed for imaging at relatively higher wavelengths, such as I-line (365 nm) and G-line (436 nm) exposures, and are generally unsuitable for imaging at short wavelengths. In particular, prior resists exhibit poor resolution (if any image at all can be developed) upon exposure to these shorter wavelengths. Among other things, current photoresists can be highly opaque to extremely short exposure wavelengths, such as 248 nm and 193 nm, thereby resulting in poorly resolved images.

Typical photoresists suitable for imaging at 248 nm or 193 nm use deprotection chemistry based on derivatives of carboxylic acids or phenolic moieties. Such deprotection chemistry is exemplified by the following reaction schemes:

Scheme 1

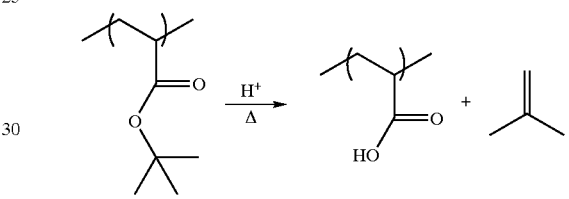

Scheme 2

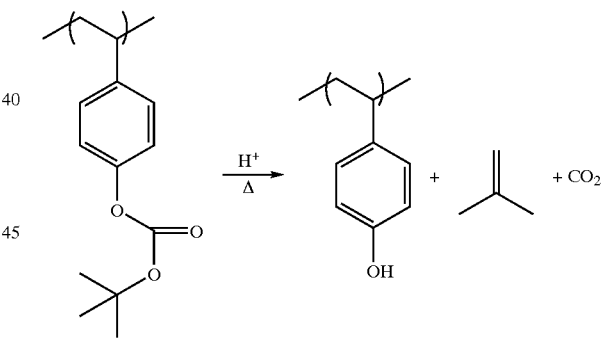

Typical deprotection chemistry, such as the above described phenolic and carboxylic acid-based deprotection schemes, are less suitable for use at wavelengths below about 160 nm because the chemical moieties involved in these schemes absorb radiation strongly in that region of the electromagnetic spectrum.

Alternatively, Feiring et al. in PCT Patent Application Nos. WO 00/17712 and WO 00/67072 disclose a variety of polymer binders for use in photoresists for imaging at 157 nm wavelengths. These and other polymer binders having greater transparency in short wavelength exposure can contain one or more electronegative groups on a monomer unit to reduce the total absorbance of the polymer. Of particular interest among these electronegative groups are fluorinated alcohol substituents as disclosed by Przybilla et al. in German Patent No. DE 42 07 261 and German Patent Application No. DE 42 07 263 because they are sufficiently acidic to allow dissolution in aqueous base developers and reduce the absorbance of the polymer.

Fluorinated alcohols can also be protected by acid cleavable groups. For example, Przybilla et al. in DE 42 07 261 disclose that fluorinated alcohol moieties can be protected by acid cleavable groups such as tri($C_1$–$C_4$)alkyl methyl, di($C_1$–$C_4$)alkyl-($C_6$–$C_{10}$)aryl-methyl, benzyl, tri($C_1$–$C_{20}$) alkyl silanyl, ($C_1$–$C_{20}$)alkoxycarbonyl, tetrahydropyranyl and tetrahydrofuranyl. In addition, Feiring et al. teach the use of the 3-cyclohexenyl ether and, more generally, alpha-alkoxyalkyl ether moieties as protecting groups for fluorinated alcohols.

For commercially viable photoresists, the choice of a protecting group depends on the following criteria:

1. The chemistry used to substitute fluorinated alcohols with protecting groups should be accomplished with sufficient ease to provide a commercially viable process for manufacturing resist raw materials.
2. The acid catalyzed deprotection reaction should be sufficiently facile to be accomplished near or below the glass transition temperature of the resist but not so facile as to undergo significant deprotection during exposure unless the products of deprotection are nonvolatile. Deprotection that is overly facile and leads to volatile products can, over many exposures, contaminate the objective exposure lens surface.
3. The deprotection reaction should occur in a manner that results in minimal shrinkage of the resist film to avoid mechanical strain that limits resolution and may be associated with the collapse of resist patterns during development.
4. The deprotection group should exhibit minimal absorbance at the exposing wavelength.
5. Byproducts from the deprotection reaction should not interfere with subsequent development of the resist image. In addition, after development and subsequently, the resist deprotection byproducts should leave no residues on the device substrate that could cause defects.

Known protecting groups for fluorinated alcohols do not meet the criteria set forth above. For example, tri($C_1$–$C_4$) alkyl methyl, di($C_1$–$C_4$)alkyl-($C_6$–$C_{10}$)aryl-methyl and benzyl ethers of fluorinated alcohols do not undergo acid catalyzed deprotection with sufficient reactivity. Further, the di($C_1$–$C_4$)alkyl-($C_6$–$C_{10}$)aryl-methyl and benzyl moieties exhibit high absorbance below 160 nm. Also, tri($C_1$–$C_{20}$) alkyl silanyl moieties and silicon containing protecting groups generally can cause post develop or post-etch residues which, in turn, can produce harmful defects on the semiconductor substrate. Additionally, ($C_1$–$C_{20}$) alkoxycarbonyl protecting groups, such as the tert-butoxycarbonyl group, can generate at least two moles of volatile byproducts per mole of deprotection events. This can lead to resist shrinkage and the volatile alkene byproduct can foul the exposure lens, particularly over a plurality of exposures. Tetrahydropyranyl and tetrahydrofuranyl and methoxymethyl ethers of fluorinated alcohols as well as vinyl ether adducts in general may undergo deprotection during exposure and create volatile byproducts that can foul the exposure lens. In addition, byproducts left in the exposed regions of the film can undergo cationic polymerization. At sufficient concentrations, the resulting polymer can interfere with development. Deprotection chemistry employing 3-cyclohexenyl ether is not sufficiently facile to be accomplished near or below the glass transition temperature of the resist, particularly when using polymers disclosed by Feiring et al.

Additionally, it is desirable to have carboxylic acid or ester functionality in photoresist polymer binders. Such functionality is convenient for functionalization of the polymer and aids in dissolution or removability of the polymer in aqueous developers and strippers. Typically, in polymer binders containing carboxylic acid or ester functionality, including conventional polymer binders for use at sub 160 nm wavelengths, such carboxylic acid or ester functionality is not present on monomer units further containing an electronegative substituent. Thus, typical monomer units containing carboxylic functionality include (meth)acrylic acid, alkyl (meth)acrylates, cyclic olefin monomers substituted with one or more carboxylic acids or esters, and the like.

U.S. Pat. No. 6,057,083 (Taylor et al.) discloses photoresist compositions particularly suitable for imaging at sub 200 nm wavelengths, such as 193 nm. The disclosed photoresist compositions include a polymer binder having an acid labile leaving group selected from optionally substituted fenchyl; optionally substituted phenyl; optionally substituted 3,2,0 bridged system; optionally substituted bridged heteroalicyclic group; and optionally substituted cycloalkyl group having 3 or 4 ring carbon atoms. Such leaving groups are bonded to the polymer binder through a carboxylate ester functionality. The use of such leaving groups on polymer binders suitable for imaging at sub 160 nm wavelengths is not disclosed. Also not disclosed in this patent is the bonding of such leaving groups to a carboxylate ester functionality including one or more electronegative substituents.

U.S. Pat. No. 6,136,501 (Trefonas et al.) discloses photoresist compositions particularly suitable for imaging at short wavelengths, such as 248 and 193 nm. The disclosed photoresist compositions include a polymer binder having a pendant ester group containing a leaving group bonded to the ester carbonyl group the, where the leaving group is an optionally substituted noncyclic alkyl moiety having 6 or more carbon atoms, with at least 2 carbon atoms selected from secondary, tertiary and quaternary carbon atoms, and wherein a quaternary carbon atom is directly bonded to the ester carbonyl group. The use of such leaving groups on polymer binders suitable for imaging at sub 160 nm wavelengths is not disclosed. Also not disclosed in this patent is the bonding of such leaving groups to a carboxylate ester functionality including one or more electronegative substituents.

It is thus desirable to have photoresist compositions that can be imaged at short wavelengths and contain resin binders that undergo facile deprotection without producing volatile byproducts, byproducts that interfere with development or byproducts that produce residues that lead to defects on the device substrate.

SUMMARY OF THE INVENTION

It has been surprisingly found that the use of certain leaving or blocking groups in a polymer binder having high transparency at sub 200 nm, and preferably at sub 160 nm, wavelengths provides a particularly useful chemically amplified positive-acting photoresist composition. Such leaving groups provide for facile deprotection of the binder polymers without producing volatile by-products.

In one aspect, the present invention provides a photoresist composition including a polymer binder and a photoactive component, wherein the polymer binder includes as polymerized units a monomer having an electronegative substituent and an ester group, wherein the monomer group includes a leaving group bonded directly to the to the ester group, wherein the leaving group is selected from a) an optionally substituted noncyclic alkyl moiety having 6 or more carbon atoms, with at least 2 carbon atoms selected from secondary, tertiary and quaternary carbon atoms, and wherein the ester group is directly bonded to a quaternary carbon atom; b) optionally substituted fenchyl; c) optionally substituted phenyl; d) optionally substituted 3,2,0 bridged system; e) optionally substituted bridged heteroalicyclic group; f) optionally substituted cycloalkyl group having 3 or 4 ring carbon atoms; and g) optionally substituted 2,2,1-bridged systems.

In a second aspect, the present invention provides a method for producing a chemically amplified photoresist including the steps of: a) preparing a binder polymer including as polymerized units a monomer having an electronegative substituent and an ester group, wherein the monomer group includes a leaving group bonded directly to the to the ester group, wherein the leaving group is selected from an optionally substituted noncyclic alkyl moiety having 6 or more carbon atoms, with at least 2 carbon atoms selected from secondary, tertiary and quaternary carbon atoms, and wherein the ester group is directly bonded to a quaternary carbon atom; optionally substituted fenchyl; optionally substituted phenyl; optionally substituted 3,2,0 bridged system; optionally substituted bridged heteroalicyclic group; optionally substituted cycloalkyl group having 3 or 4 ring carbon atoms; and optionally substituted 2,2,1-bridged systems; and b) combining the binder polymer with a photoactive component.

In a third aspect, the present invention provides a method for forming a photoresist relief image including the steps of: a) applying on a substrate a layer of a photoresist composition including a polymer binder and a photoactive component, wherein the polymer binder includes as polymerized units a monomer having an electronegative substituent and an ester group, wherein the monomer group includes a leaving group bonded directly to the to the ester group, wherein the leaving group is selected from an optionally substituted noncyclic alkyl moiety having 6 or more carbon atoms, with at least 2 carbon atoms selected from secondary, tertiary and quaternary carbon atoms, and wherein the ester group is directly bonded to a quaternary carbon atom; optionally substituted fenchyl; optionally substituted phenyl; optionally substituted 3,2,0 bridged system; optionally substituted bridged heteroalicyclic group; optionally substituted cycloalkyl group having 3 or 4 ring carbon atoms; and optionally substituted 2,2,1-bridged systems; and b) exposing and developing the photoresist to provide a relief image.

In a fourth aspect, the present invention provides an electronic device substrate including a coating including a layer of a photoresist composition including a polymer binder and a photoactive component, wherein the polymer binder includes as polymerized units a monomer having an electronegative substituent and an ester group, wherein the monomer group includes a leaving group bonded directly to the to the ester group, wherein the leaving group is selected from a) an optionally substituted noncyclic alkyl moiety having 6 or more carbon atoms, with at least 2 carbon atoms selected from secondary, tertiary and quaternary carbon atoms, and wherein the ester group is directly bonded to a quaternary carbon atom; b) optionally substituted fenchyl; c) optionally substituted phenyl; d) optionally substituted 3,2,0 bridged system; e) optionally substituted bridged heteroalicyclic group; f) optionally substituted cycloalkyl group having 3 or 4 ring carbon atoms; and g) optionally substituted 2,2,1-bridged systems.

In a fifth aspect, the present invention provides a method of manufacturing an electronic device including the steps of: a) disposing on an electronic device substrate a layer of a photoresist composition including a polymer binder and a photoactive component, wherein the polymer binder includes as polymerized units a monomer having an electronegative substituent and an ester group, wherein the monomer group includes a leaving group bonded directly to the to the ester group, wherein the leaving group is selected from an optionally substituted noncyclic alkyl moiety having 6 or more carbon atoms, with at least 2 carbon atoms selected from secondary, tertiary and quaternary carbon atoms, and wherein the ester group is directly bonded to a quaternary carbon atom; optionally substituted fenchyl; optionally substituted phenyl; optionally substituted 3,2,0 bridged system; optionally substituted bridged heteroalicyclic group; optionally substituted cycloalkyl group having 3 or 4 ring carbon atoms; and optionally substituted 2,2,1-bridged systems; b) exposing and developing the photoresist to provide a relief image; c) etching features in the substrate; and d) removing the photoresist composition.

In a sixth aspect, the present invention provides a photoresist composition including a polymer binder and a photoactive component, wherein the polymer binder includes as polymerized units a monomer having an electronegative substituent and an ester group, wherein a spacer is interposed between the ester group and a leaving group, wherein the leaving group is selected from a) an optionally substituted noncyclic alkyl moiety having 6 or more carbon atoms, with at least 2 carbon atoms selected from secondary, tertiary and quaternary carbon atoms, and wherein the ester group is directly bonded to a quaternary carbon atom; b) optionally substituted fenchyl; c) optionally substituted phenyl; d) optionally substituted 3,2,0 bridged system; e) optionally substituted bridged heteroalicyclic group; f) optionally substituted cycloalkyl group having 3 or 4 ring carbon atoms; and g) optionally substituted 2,2,1-bridged systems.

In a seventh aspect, the present invention provides a method for producing a chemically amplified photoresist including the steps of: a) preparing a binder polymer including as polymerized units a monomer having an electronegative substituent and an ester group, wherein the monomer group includes a spacer interposed between the ester group and a leaving group, wherein the leaving group is selected from an optionally substituted noncyclic alkyl moiety having 6 or more carbon atoms, with at least 2 carbon atoms selected from secondary, tertiary and quaternary carbon atoms, and wherein the ester group is directly bonded to a quaternary carbon atom; optionally substituted fenchyl; optionally substituted phenyl; optionally substituted 3,2,0 bridged system; optionally substituted bridged heteroalicyclic group; optionally substituted cycloalkyl group having 3 or 4 ring carbon atoms; and optionally substituted 2,2,1-bridged systems; and b) combining the binder polymer with a photoactive component.

In an eighth aspect, the present invention provides a method for forming a photoresist relief image including the steps of: a) applying on a substrate a layer of a photoresist composition including a polymer binder and a photoactive component, wherein the polymer binder includes as polymerized units a monomer having an electronegative substituent and an ester group, wherein a spacer is interposed between the ester group and a leaving group, wherein the leaving group is selected from an optionally substituted noncyclic alkyl moiety having 6 or more carbon atoms, with at least 2 carbon atoms selected from secondary, tertiary and quaternary carbon atoms, and wherein the ester group is directly bonded to a quaternary carbon atom; optionally substituted fenchyl; optionally substituted phenyl; optionally substituted 3,2,0 bridged system; optionally substituted bridged heteroalicyclic group; optionally substituted cycloalkyl group having 3 or 4 ring carbon atoms; and optionally substituted 2,2,1-bridged systems; and b) exposing and developing the photoresist to provide a relief image.

In a ninth aspect, the present invention provides an electronic device substrate including a coating including a layer of a photoresist composition including a polymer binder and a photoactive component, wherein the polymer binder includes as polymerized units a monomer having an electronegative substituent and an ester group, wherein a spacer is interposed between the ester group and a leaving group, wherein the leaving group is selected from a) an optionally substituted noncyclic alkyl moiety having 6 or more carbon atoms, with at least 2 carbon atoms selected from secondary, tertiary and quaternary carbon atoms, and wherein the ester group is directly bonded to a quaternary carbon atom; b) optionally substituted fenchyl; c) optionally substituted phenyl; d) optionally substituted 3,2,0 bridged system; e) optionally substituted bridged heteroalicyclic group; f) optionally substituted cycloalkyl group having 3 or 4 ring carbon atoms; and g) optionally substituted 2,2,1-bridged systems.

In a tenth aspect, the present invention provides a method of manufacturing an electronic device including the steps of: a) disposing on an electronic device substrate a layer of a photoresist composition including a polymer binder and a photoactive component, wherein the polymer binder includes as polymerized units a monomer having an electronegative substituent and an ester group, wherein a spacer is interposed between the ester group and a leaving group, wherein the leaving group is selected from an optionally substituted noncyclic alkyl moiety having 6 or more carbon atoms, with at least 2 carbon atoms selected from secondary, tertiary and quaternary carbon atoms, and wherein the ester group is directly bonded to a quaternary carbon atom; optionally substituted fenchyl; optionally substituted phenyl; optionally substituted 3,2,0 bridged system; optionally substituted bridged heteroalicyclic group; optionally substituted cycloalkyl group having 3 or 4 ring carbon atoms; and optionally substituted 2,2,1-bridged systems; b) exposing and developing the photoresist to provide a relief image; c) etching features in the substrate; and d) removing the photoresist composition.

DETAILED DESCRIPTION OF THE INVENTION

As used throughout this specification, the following abbreviations shall have the following meanings, unless the context clearly indicates otherwise: ° C.=degrees Centigrade; g=gram; wt %=percent by weight; mJ=millijoules; cm=centimeter; N=normal; nm=nanometer; FA=fluoroacrylate or $H_2C=CF-COO-R$; and TFMA= trifluoromethacrylate or $H_2C=C(CF_3)COO-R$.

The terms "resin" and "polymer" are used interchangeably throughout this specification. The term "alkyl" refers to linear, branched and cyclic alkyl and includes alkylidene. The terms "halogen" and "halo" include fluorine, chlorine, bromine, and iodine. Thus the term "halogenated" refers to fluorinated, chlorinated, brominated, and iodinated. "Polymers" refer to both homopolymers and copolymers. The term "(meth)acrylate" refers to both acrylate and methacrylate. Likewise, the term "(meth)acrylic" refers to both acrylic and methacrylic. The term "monomer" refers to any ethylenically or acetylenically unsaturated compound capable of being polymerized. "Fluoroalkyl" refers to both partially fluorinated and perfluorinated alkyl.

All amounts are percent by weight and all ratios are by weight, unless otherwise noted. All numerical ranges are inclusive and combinable in any order, except where it is obvious that such numerical ranges are constrained to add up to 100%.

The photoresist composition including a polymer binder and a photoactive component, wherein the polymer binder includes as polymerized units a monomer having an electronegative substituent and an ester group, wherein the monomer group includes a leaving group bonded directly to the to the ester group, wherein the leaving group is selected from a) an optionally substituted noncyclic alkyl moiety having 6 or more carbon atoms, with at least 2 carbon atoms selected from secondary, tertiary and quaternary carbon atoms, and wherein the ester group is directly bonded to a quaternary carbon atom; b) optionally substituted fenchyl; c) optionally substituted phenyl; d) optionally substituted 3,2,0 bridged system; e) optionally substituted bridged heteroalicyclic group; f) optionally substituted cycloalkyl group having 3 or 4 ring carbon atoms; and g) optionally substituted 2,2,1-bridged systems.

A wide variety of polymer binders may suitably be used in the present invention, provided that they have sufficient transparency for use at the desired wavelengths, particularly at sub 200 nm and more particularly at sub 160 nm wavelength radiation. Suitable polymer binders include those containing as polymerized units one or more fluorine containing monomers. Also suitable are copolymer binders including, but not limited to, those binders including as polymerized units one or more fluorine containing monomers and one or more one or more ethylenically or acetylenically unsaturated monomers. The total amount of the ethylenically and acetylenically unsaturated monomers useful in the polymer of the present invention is from 1 to 99 percent by weight, based on the total weight of the monomers, preferably from 10 to 95 percent by weight, more preferably from 20 to 90 percent by weight, and even more preferably from 60 to 90 percent by weight. The fluorine containing monomers useful in the present invention are present in an amount of from about 1 to about 99 percent by weight, preferably from about 10 to about 95 percent by weight, more preferably from 20 to 90 percent by weight, and even more preferably from 60 to 90 percent by weight.

A variety of fluorine containing monomers may be used in the polymer binders of the present invention, such as those disclosed in PCT patent application WO 00/17712 (Feiring et al.). It will be appreciated that one or more fluorine containing monomers may be used in the present polymer binders. Preferably, the fluorinated monomers or crosslinkers are highly fluorinated. Any monomer containing a fluoroalkyl group, such as trifluoromethyl, is particularly suitable. Suitable fluorinated monomers include, but are not limited to fluorinated (meth)acrylates and (meth) acrylamides such as fluoroalkyl (meth)acrylate such as fluoro($C_1-C_{20}$)alkyl (meth)acrylate, fluorocycloalkyl (meth) acrylate, fluoroalkylsulfoamidoethyl (meth)acrylate, fluoroalkylamidoethyl (meth)acrylate, fluoroalkyl (meth) acrylamide, fluoroalkylpropyl (meth)acrylate, fluoroalkylethyl poly(alkyleneoxide) (meth)acrylate, fluoroalkylsulfoethyl (meth)acrylate, $\alpha H,\alpha H,\omega H,\omega H$-perfluoroalkanediol di(meth)acrylate and β-substituted fluoroalkyl (meth)acrylate; fluorinated vinyl ethers such as fluoroalkylethyl vinyl ether and fluoroalkylethyl poly (ethyleneoxide) vinyl ether; fluorinatedalcohol vinyl ethers;

fluorinated vinyl acetates; fluorinatedalkyl vinyl acetates such as trifluoromethyl vinyl acetate; fluorinated ethylene such as vinylidene fluoride, trifluoroethylene and tetrafluoroethylene; fluorinated α-olefins; fluorinated dienes such as perfluorobutadiene and 1-fluoroalkylperfluorobutadiene, fluorinated heterocycles such as perfluoro-(2,2-dimethyl-1,3-dioxole) and perfluoro-(2-methylene-4-methyl-1,3-dioxolane). Preferred fluoroinated monomers include perfluorooctylethyl (meth)acrylate, perfluorooctylethyl (meth)acrylate, octafluoropentyl (meth)acrylate, trifluoroethyl (meth)acrylate, tetrafluoropropyl (meth)acrylate, vinylidene fluoride, trifluoroethylene, tetrafluoroethylene, perfluoro-(2,2-dimethyl-1,3-dioxole) and perfluoro-(2-methylene-4-methyl-1,3-dioxolane).

Suitable ethylenically or acetylenically unsaturated monomers useful in preparing copolymers as the present photoresist binders include, but are not limited to: (meth)acrylic acid, (meth)acrylamides, alkyl (meth)acrylates, alkenyl (meth)acrylates, aromatic (meth)acrylates, vinyl aromatic monomers, nitrogen-containing compounds and their thio-analogs, substituted ethylene monomers, cyclic olefins, substituted cyclic olefins, and the like. Cyclic olefins and substituted cyclic olefins are preferred.

Typically, the alkyl (meth)acrylates useful in the present invention are ($C_1$–$C_{24}$)alkyl (meth)acrylates. Suitable alkyl (meth)acrylates include, but are not limited to, "low cut" alkyl (meth)acrylates, "mid cut" alkyl (meth)acrylates and "high cut" alkyl (meth)acrylates.

"Low cut" alkyl (meth)acrylates are typically those where the alkyl group contains from 1 to 6 carbon atoms. Suitable low cut alkyl (meth)acrylates include, but are not limited to: methyl methacrylate ("MMA"), methyl acrylate, ethyl acrylate, propyl methacrylate, butyl methacrylate ("BMA"), butyl acrylate ("BA"), isobutyl methacrylate ("IBMA"), hexyl methacrylate, cyclohexyl methacrylate, cyclohexyl acrylate and mixtures thereof.

"Mid cut" alkyl (meth)acrylates are typically those where the alkyl group contains from 7 to 15 carbon atoms. Suitable mid cut alkyl (meth)acrylates include, but are not limited to: 2-ethylhexyl acrylate ("EHA"), 2-ethylhexyl methacrylate, octyl methacrylate, decyl methacrylate, isodecyl methacrylate ("IDMA", based on branched ($C_{10}$)alkyl isomer mixture), undecyl methacrylate, dodecyl methacrylate (also known as lauryl methacrylate), tridecyl methacrylate, tetradecyl methacrylate (also known as myristyl methacrylate), pentadecyl methacrylate and mixtures thereof. Particularly useful mixtures include dodecyl-pentadecyl methacrylate ("DPMA"), a mixture of linear and branched isomers of dodecyl, tridecyl, tetradecyl and pentadecyl methacrylates; and lauryl-myristyl methacrylate ("LMA").

"High cut" alkyl (meth)acrylates are typically those where the alkyl group contains from 16 to 24 carbon atoms. Suitable high cut alkyl (meth)acrylates include, but are not limited to: hexadecyl methacrylate, heptadecyl methacrylate, octadecyl methacrylate, nonadecyl methacrylate, cosyl methacrylate, eicosyl methacrylate and mixtures thereof. Particularly useful mixtures of high cut alkyl (meth)acrylates include, but are not limited to: cetyl-eicosyl methacrylate ("CEMA"), which is a mixture of hexadecyl, octadecyl, cosyl and eicosyl methacrylate; and cetyl-stearyl methacrylate ("SMA"), which is a mixture of hexadecyl and octadecyl methacrylate.

The mid-cut and high-cut alkyl (meth)acrylate monomers described above are generally prepared by standard esterification procedures using technical grades of long chain aliphatic alcohols, and these commercially available alcohols are mixtures of alcohols of varying chain lengths containing between 10 and 15 or 16 and 20 carbon atoms in the alkyl group. Examples of these alcohols are the various Ziegler catalyzed ALFOL alcohols from Vista Chemical company, i.e., ALFOL 1618 and ALFOL 1620, Ziegler catalyzed various NEODOL alcohols from Shell Chemical Company, i.e. NEODOL 25L, and naturally derived alcohols such as Proctor & Gamble's TA-1618 and CO-1270. Consequently, for the purposes of this invention, alkyl (meth)acrylate is intended to include not only the individual alkyl (meth)acrylate product named, but also to include mixtures of the alkyl (meth)acrylates with a predominant amount of the particular alkyl (meth)acrylate named.

The alkyl (meth)acrylate monomers useful in the present invention may be a single monomer or a mixture having different numbers of carbon atoms in the alkyl portion. Also, the (meth)acrylamide and alkyl (meth)acrylate monomers useful in the present invention may optionally be substituted. Suitable optionally substituted (meth)acrylamide and alkyl (meth)acrylate monomers include, but are not limited to: hydroxy ($C_2$–$C_6$)alkyl (meth)acrylates, dialkylamino ($C_2$–$C_6$)-alkyl (meth)acrylates, dialkylamino($C_2$–$C_6$)alkyl (meth)acrylamides.

Particularly useful substituted alkyl (meth)acrylate monomers are those with one or more hydroxyl groups in the alkyl radical, especially those where the hydroxyl group is found at the β-position (2-position) in the alkyl radical. Hydroxyalkyl (meth)acrylate monomers in which the substituted alkyl group is a ($C_2$–$C_6$)alkyl, branched or unbranched, are preferred. Suitable hydroxyalkyl (meth)acrylate monomers include, but are not limited to: 2-hydroxyethyl methacrylate ("HEMA"), 2-hydroxyethyl acrylate ("HEA"), 2-hydroxypropyl methacrylate, 1-methyl-2-hydroxyethyl methacrylate, 2-hydroxy-propyl acrylate, 1-methyl-2-hydroxyethyl acrylate, 2-hydroxybutyl methacrylate, 2-hydroxybutyl acrylate and mixtures thereof. The preferred hydroxyalkyl (meth)acrylate monomers are HEMA, 1-methyl-2-hydroxyethyl methacrylate, 2-hydroxypropyl methacrylate and mixtures thereof. A mixture of the latter two monomers is commonly referred to as "hydroxypropyl methacrylate" or HPMA.

Other substituted (meth)acrylate and (meth)acrylamide monomers useiful in the present invention are those with a dialkylamino group or dialkylaminoalkyl group in the alkyl radical. Examples of such substituted (meth)acrylates and (meth)acrylamides include, but are not limited to: dimethylaminoethyl methacrylate, dimethylaminoethyl acrylate, N,N-dimethylaminoethyl methacrylamide, N,N-dimethylaminopropyl methacrylamide, N,N-dimethylaminobutyl methacrylamide, N,N-di-ethylaminoethyl methacrylamide, N,N-diethylaminopropyl methacrylamide, N,N-diethylaminobutyl methacrylamide, N-(1,1-dimethyl-3-oxobutyl) acrylamide, N-(1,3-diphenyl-1-ethyl-3-oxobutyl) acrylamide, N-(1-methyl-1-phenyl-3-oxobutyl) methacrylamide, and 2-hydroxyethyl acrylamide, N-methacrylamide of aminoethyl ethylene urea, N-methacryloxy ethyl morpholine, N-maleimide of dimethylaminopropylamine and mixtures thereof.

Other substituted (meth)acrylate monomers useful in the present invention are silicon-containing monomers such as γ-propyl tri($C_1$–$C_6$)alkoxysilyl (meth)acrylate, γ-propyl tri($C_1$–$C_6$)alkylsilyl (meth)acrylate, γ-propyl di($C_1$–$C_6$)alkoxy($C_1$–$C_6$)alkylsilyl (meth)acrylate, γ-propyl di($C_1$–$C_6$)alkyl($C_1$–$C_6$)alkoxysilyl (meth)acrylate, vinyl tri(C1–C6) alkoxysilyl (meth)acrylate, vinyl di($C_1$–$C_6$)alkoxy($C_1$–$C_6$)alkylsilyl (meth)acrylate, vinyl ($C_1$–$C_6$)alkoxydi($C_1$–$C_6$)alkylsilyl (meth)acrylate, vinyl tri($C_1$–$C_6$)alkylsilyl (meth)acrylate, and mixtures thereof.

The vinyl aromatic monomers useful as unsaturated monomers in the present invention include, but are not limited to: styrene ("STY"), α-methylstyrene, vinyltoluene, p-methylstyrene, ethylvinylbenzene, vinylnaphthalene, vinylxylenes, and mixtures thereof. The vinylaromatic monomers also include their corresponding substituted counterparts, such as halogenated derivatives, i.e., containing one or more halogen groups, such as fluorine, chlorine or bromine; and nitro, cyano, $(C_1-C_{10})$alkoxy, halo$(C_1-C_{10})$ alkyl, carb$(C_1-C_{10})$alkoxy, carboxy, amino, $(C_1-C_{10})$ alkylamino derivatives and the like.

The nitrogen-containing compounds and their thio-analogs useful as unsaturated monomers in the present invention include, but are not limited to: vinylpyridines such as 2-vinylpyridine or 4-vinylpyridine; lower alkyl $(C_1-C_8)$ substituted N-vinyl pyridines such as 2-methyl-5-vinyl-pyridine, 2-ethyl-5-vinylpyridine, 3-methyl-5-vinylpyridine, 2,3-dimethyl-5-vinyl-pyridine, and 2-methyl-3-ethyl-5-vinylpyridine; methyl-substituted quinolines and isoquinolines; N-vinylcaprolactam; N-vinylbutyrolactam; N-vinylpyrrolidone; vinyl imidazole; N-vinyl carbazole; N-vinyl-succinimide; (meth)acrylonitrile; o-, m-, or p-aminostyrene; maleimide; N-vinyl-oxazolidone; N,N-dimethyl aminoethyl-vinyl-ether; ethyl-2-cyano acrylate; vinyl acetonitrile; N-vinylphthalimide; N-vinyl-pyrrolidones such as N-vinyl-thio-pyrrolidone, 3 methyl-1-vinyl-pyrrolidone, 4-methyl-1-vinyl-pyrrolidone, 5-methyl-1-vinyl-pyrrolidone, 3-ethyl-1-vinyl-pyrrolidone, 3-butyl-1-vinyl-pyrrolidone, 3,3-dimethyl-1-vinyl-pyrrolidone, 4,5-dimethyl-1-vinyl-pyrrolidone, 5,5-dimethyl-1-vinyl-pyrrolidone, 3,3,5-trimethyl-1-vinyl-pyrrolidone, 4-ethyl-1-vinyl-pyrrolidone, 5-methyl-5-ethyl-1-vinyl-pyrrolidone and 3,4,5-trimethyl-1-vinyl-pyrrolidone; vinyl pyrroles; vinyl anilines; and vinyl piperidines.

The substituted ethylene monomers useful as unsaturated monomers is in the present invention include, but are not limited to: vinyl acetate, vinyl formamide, vinyl chloride, vinyl fluoride, vinyl bromide, vinylidene chloride, vinylidene fluoride, vinylidene bromide and itaconic anhydride.

Suitable cyclic olefin monomers useful in the present invention are $(C_5-C_{10})$cyclic olefins, such as cyclopentene, cyclopentadiene, dicylopentene, cyclohexene, cyclohexadiene, cycloheptene, cycloheptadiene, cyclooctene, cyclooctadiene, norbornene, maleic anhydride and the like. Suitable substituted cyclic olefin monomers include, but are not limited to, cyclic olefins having one or more substituent groups selected from hydroxy, aryloxy, halo, $(C_1-C_{12})$alkyl, $(C_1-C_2)$haloalkyl, $(C_1-C_{12})$ hydroxyalkyl, $(C_1-C_{12})$halohydroxyalkyl such as $(CH_2)_{n'}C(CF_3)_2OH$ where n'=0 to 4, $(C_1-C_{12})$alkoxy, thio, amino, $(C_1-C_{c6})$dialkylamino, $(C_1-C_{12})$alkylthio, carbo$(C_1-C_{20})$ alkoxy, carbo$(C_1-C_{20})$haloalkoxy, $(C_1-C_{12})$acyl, $(C_1-C_6)$ alkylcarbonyl$(C_1-C_6)$alkyl, and the like. Particularly suitable substituted cyclic olefins include maleic anhydride and cyclic olefins containing one or more of hydroxy, aryloxy, $(C_1-C_{12})$alkyl, $(C_1-C_{12})$haloalkyl, $(C_1-C_{12})$hydroxyalkyl, $(C_1-C_{12})$halohydroxyalkyl, carbo $(C_1-C_{20})$alkoxy, and carbo$(C_1-C_{20})$haloalkoxy. It will be appreciated by those skilled in the art that the alkyl and alkoxy substituents may be optionally substituted, such as with halogen, hydroxyl, cyano, $(C_1-C_6)$alkoxyl, mercapto, $(C_1-C_6)$alkylthio, amino, acid labile leaving group and the like.

Suitable ethylenically unsaturated cyclic olefins having one or more hydroxy groups include, but are not limited to, norbornenyl alcohols of Formula (I)

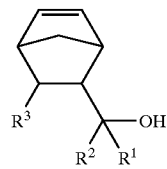

(I)

wherein $R^1$, $R^2$ and $R^3$ are independently hydrogen and $(C_1-C_8)$alkyl and wherein $R^1$ and $R^3$ may be joined to form a 5- to 7-member fused ring. It is preferred that $R^1$ and $R^3$ are independently selected from hydrogen or $(C_1-C_8)$alkyl, $R^2$=cyclohexyl or cyclopentyl, and $R^2$ and $R^3$ may be joined to form a 5- to 7-member fused ring. It is further preferred that $R^1$ is hydrogen or methyl. Particularly useful norbornenyl alcohols are those of the Formulae Ia–Ic.

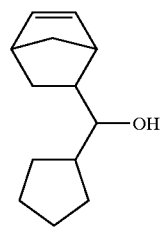

(Ia)

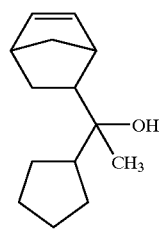

(Ib)

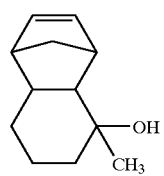

(Ic)

The polymer binders of the present invention include as polymerized units one or more monomers having an electronegative substituent and an ester group, wherein the leaving group is bonded directly to the ester group. Particularly useful monomers are those having an electronegative substituent alpha to the ester group, wherein the ester group comprises a leaving group bonded directly to the ester group. By "alpha to an ester group" it is meant that the electronegative substituent is bonded to the same carbon of the polymer as the ester group, such as in Formula II, whereLG is the leaving group and n is the number of repeat units in the polymer and is typically a number from 2 to 100,000.

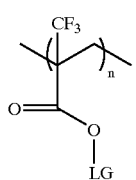

(II)

Electronegative substituents are any which are more electronegative than oxygen. Exemplary electronegative substituents include, but are not limited to, fluorine and substituents containing one or more fluorine atoms such as fluoroalkyl. Particularly useful fluoroalkyl groups include fluoro($C_1$–$C_4$)alkyl. Preferred fluoroalkyl groups include fluoromethyl, difluoromethyl, trifluoromethyl, fluoroethyl, difluoroethyl, trifluoroethyl, perfluoroethyl and the like. Preferred electronegative substituents are fluorine and trifluoromethyl. Thus, preferred monomers include fluoroacrylate esters and trifluoromethacrylate esters. It will be appreciated by those skilled in the art that a variety of electronegative substituents may be present. Thus, the polymer binders of the present invention may include one or more different electronegative substituents.

While not intending to be bound by theory, it is believed that the presence of electronegative substituents alpha to the ester group greatly reduce the rate of protonation of the ester group. Such reduced protonation adversely affects the lithography by not providing a sufficient solubility change to render the binder polymer developable.

In an alternative embodiment, one or more spacer groups, such as methyleneoxy (i.e."—$CH_2$—O—") or two or more methyleneoxy groups, may be disposed between the ester group and the leaving group, such as in Formula III, where $R^1$ is H or ($C_1$–$C_4$)alkyl, LG is a leaving group and n is the number of repeat units in the polymer and is typically a number from 2 to 100,000.

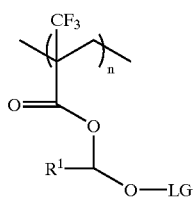

(III)

While not intending to be bound by theory, it is believed that an advantage of such spacer groups is that the oxygen adjacent to the leaving group is protonated, resulting in the cleavage of the bond between the oxygen and the leaving group. The leaving group is cleaved as a carbonium ion and, in the case of a methyleneoxy spacer group, formaldehyde is lost, resulting in formation of the corresponding carboxylic acid. Thus, the present invention also provides a photoresist composition including a polymer binder and a photoactive component, wherein the polymer binder includes as polymerized units a monomer having an electronegative substituent and an ester group, wherein a spacer is interposed between the ester group and a leaving group, wherein the leaving group is selected from a) an optionally substituted noncyclic alkyl moiety having 6 or more carbon atoms, with at least 2 carbon atoms selected from secondary, tertiary and quaternary carbon atoms, and wherein the ester group is directly bonded to a quaternary carbon atom; b) optionally substituted fenchyl; c) optionally substituted phenyl; d) optionally substituted 3,2,0 bridged system; e) optionally substituted bridged heteroalicyclic group; f) optionally substituted cycloalkyl group having 3 or 4 ring carbon atoms; and g) optionally substituted 2,2,1-bridged systems.

Leaving groups which may be advantageously used with the polymer binders of the present invention which include as polymerized units one or more monomers having an electronegative substituent alpha to an ester group, are typically those that readily or facilely form carbonium ions. Suitable leaving groups include, but are not limited to, a) an optionally substituted noncyclic alkyl moiety having 6 or more carbon atoms, with at least 2 carbon atoms selected from secondary, tertiary and quaternary carbon atoms, and wherein the ester group is directly bonded to a quaternary carbon atom; b) optionally substituted fenchyl; c) optionally substituted phenyl; d) optionally substituted 3,2,0 bridged system; e) optionally substituted bridged heteroalicyclic group; f) optionally substituted cycloalkyl group having 3 or 4 ring carbon atoms; and g) optionally substituted 2,2,1-bridged systems.

Particularly useful monomers of the present invention are those having the general structure of Formula (IV)

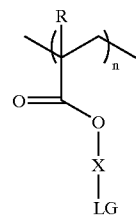

(IV)

where R=F or fluoro($C_1$–$C_4$)alkyl, X=(CHR$^1$O)$_n$, $R^1$=H or ($C_1$–$C_4$)alkyl, LG=a leaving group, and n=0 or 1. It is preferred that R=F or $CF_3$. It is also preferred that $R^1$=H.

Suitable noncyclic alkyl moieties as leaving groups include those that have one, two or more tertiary carbon atoms, and/or one, two or more quaternary carbons. References herein to a "secondary" carbon indicate the carbon atom has two non-hydrogen substituents (i.e. $CH_2RR^1$ where R and $R^1$ are the same or different and each is other than hydrogen); references herein to a "tertiary" carbon indicate the carbon atom has three non-hydrogen substituents (i.e. CHRR$^1$R$^2$ where R, $R^1$ and $R^2$ are the same or different and each is other than hydrogen); and references herein to a "quaternary" carbon indicate the carbon atom has four non-hydrogen substituents (i.e. CRR$^1$R$^2$R$^3$ where R, $R^1$, $R^2$ and $R^3$ are each the same or different and each is other than hydrogen). See, for instance, Morrison and Boyd, Organic Chemistry, particularly at page 85 (3rd ed., Allyn and Bacon), for a discussion of those terms secondary, tertiary and quaternary. It is often preferred that a quaternary carbon is directly linked (i.e. covalently linked with no other interpose atoms) to the ester group.

Preferred ester groups of polymers of the invention contain only saturated carbon atoms. Thus, e.g., in this preferred aspect of the invention, the groups R, $R^1$, $R^2$, $R^3$ of the above formulae for secondary, tertiary and quaternary carbons of ester groups (i.e. the formulae $CH_2RR^1$, CHRR$^1$R$^2$, CRR$^1$R$^2$R$^3$) are each saturated alkyl, typically ($C_1$–$C_{10}$) alkyl, more typically ($C_1$–$C_6$)alkyl, still more typically alkyl having 1, 2, 3 or 4 carbons. Preferred alkyl moieties include those having 1 quaternary carbon linked to the ester group and one or more additional tertiary or quaternary carbon atoms and not more than a one single ring alicyclic group.

Additional preferred alkyl moieties include those having 1 quaternary carbon linked to the ester group and one or more additional secondary carbon atoms and no more than one ring alicyclic groups. Optimally, the ester group will contain only carbon and hydrogen atoms and be free of double or triple bonds. More preferred alkyl moieties include those having one quaternary carbon linked to the ester group and one or more additional quaternary or tertiary carbon atoms and not more than a one single ring alicyclic group. Optimally, the ester group will contain solely carbon and hydrogen atoms and be free of double or triple bonds. Particularly suitable leaving groups containing a quaternary carbon bonded directly to the ester group include, but are not limited to, those having the structures of Formulae (V)–(XI), where R is an electronegative substituent, and preferably R is F or $CF_3$, and n is a number from 2 to 100,000, preferably from 5 to 50,000 and more preferably from 8 to 5000.

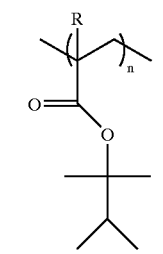

(V)

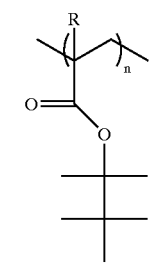

(VI)

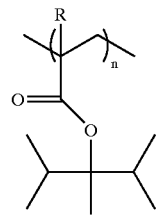

(VII)

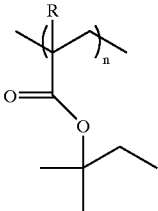

(VIII)

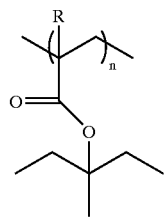

(IX)

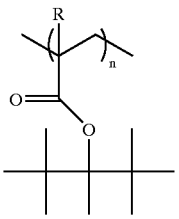

(X)

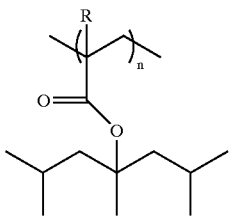

(XI)

Particularly suitable leaving groups having a quaternary carbon bonded directly to the ester group include, but are not limited to, 2,3-dimethyl-2-butyl; 2,3,3-trimethyl-2-butyl; 2-methyl-2-butyl; 3-methyl-3-pentyl; 2,3,4-trimethyl-3-pentyl; 2,2,3,4,4-pentamethyl-3-pentyl; 1-methyl-1-cyclopentyl; 1,2-dimethyl-1-cyclopentyl; 1,2,5-trimethyl-1-cyclopentyl; 1,2,2-trimethyl-cyclopentyl; 2,2,5,5-tetramethyl-1-cyclopentyl; 1-methyl-1-cyclohexyl; 1,2-dimethyl-1-cyclohexyl; 1,2,6-trimethyl-1-cyclohexyl; 1,2,2,6-tetramethyl-1-cyclohexyl; 1,2,2,6,6-pentamethyl-1-cyclohexyl; and 2,4,6-trimethyl-4-heptyl.

Other suitable leaving groups useful in the present compositions include those that provide anchimeric assistance during acid-induced cleavage of the leaving groups. Such anchimeric assistance, also known as neighboring group participation, typically involves stabilization of a carbocation intermediate generated during deprotection of the polymer's acid labile groups. Particularly suitable groups that provide anchimeric assistance during acid-induced cleavage are bridged alicyclic groups, particularly optionally substituted isobornyl. Other suitable bridged acid-labile leaving groups include, but are not limited to, those prepared from fenchol, pinenol, 3,2,0 bridged-systems and 2,2,1-bridged systems. Optionally substituted heteroatom-containing groups are also preferred, particularly bridged heteroalicyclic groups such as thio- and oxo-isobornyl and norbornyl derivatives. Also preferred are acid labile groups of optionally substituted small-ring alicyclic groups, e.g. optionally substituted cycloalkylgroups having 3 or 4 ring carbon atoms such as cyclopropylmethylene and cyclobutyl. Optionally substituted alkenyl groups are also suitable, particularly allyl- and "homo-allyl"-esters, such as alkenylesters of the formula —C(O)—O(CH$_2$)$_{1 \text{ or } 2}$—CH═CH$_2$ and which may be optionally substituted at available positions.

Particularly suitable leaving groups providing anchimeric assistance include optionally substituted fenchyl; optionally substituted phenyl; optionally substituted 3,2,0 bridged system; optionally substituted 2,2,1-bridged systems, optionally substituted bridged heteroalicyclic groups; and optionally substituted cycloalkyl group having 3 or 4 ring carbon atoms. Suitable bridge systems useful as leaving groups include, but are not limited to, those having the structures of Formulae (XII) and (XIII)

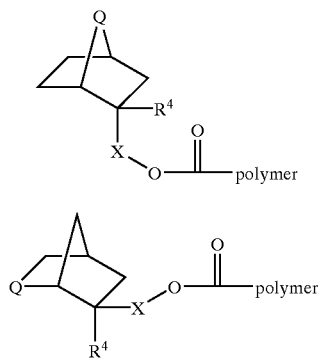

where Q=S or O; $R^4$=($C_1$–$C_2$)alkyl; X=$(CHR^1O)_n$, $R^1$=H or ($C_1$–$C_4$)alkyl; and n=0 or 1.

Without intending to be bound by theory, such leaving groups providing anchimeric assistance, such as isobornyl, are believed to form an intermediate during the deprotection reaction that includes a delocalized carbocation. Bridged heteroalicyclic groups as exemplified by the thionorbornyl and oxonorbornyl derivatives, again, without wishing to be bound by theory, are believed to be capable of forming a stabilized sulfonium ion derivative in the case of thio-derivatives, and a stabilized oxonium ion intermediate in the case of oxo-derivatives. It also should be appreciated that geometric relationships can be essential, e.g. the thionorbornyl group should be in the endo form to facilitate the photoacid-induced cleavage reaction.

While not intending to be bound by theory, it is believed that the relatively large steric size of the leaving group can impart high dissolution contrast upon loss of the leaving group, and that the presence of a second branch point can reduce the recombination rate of the leaving group, thereby increasing photospeed and/or reducing processing temperature (i.e. post-exposure bake temperatures).

Polymers of the invention may suitably contain other units in addition to the above-discussed acid labile esterss. For instance, polymers of the invention may contain units that are essentially unreactive under typical lithographic processing of a photoresist containing the polymer as a resin binder component. Thus, for instance, polymers of the invention may suitably include pendant substituted and unsubstituted alicyclic groups such as alicyclic groups having 5 to about 18 carbons, e.g. substituted or unsubstituted isobornyl, norbornyl, 2-methyladamantyl, cyclohexyl, etc.

Copolymers particularly suitable for use as polymer binders in the present invention include, but are not limited to, TFE/norbornene/fenchyl-TFMA, TFE/nonbornene carboxylic acid/isobornyl-TFMA, TFE/norbornene/nonbornene carboxylic acid/fenchyl-FA, TFE/nonbornene/acrylic acid/norbornyl-FA, TFE/nonbornene/ethylene/thionorbornyl-TFMA, TFE/nonbornene/methacrylic acid/isobornyl-FA, TFE/nonbornene/isobornyl-TFMA, TFE/nonbornene/acrylic acid/2,3,4-trimethyl-3-pentyl-FA, TFE/nonbornene/methacrylic acid/2,3,4-trimethyl-3-pentyl-TFMA, TFE/nonbornene/vinyl acetate/2,2,3,4,4-pentamethyl-3-pentyl-FA, TFE/nonbornene/vinyl alcohol/2,2,3,4,4-pentamethyl-3-pentyl-TFMA, TFE/nonbornene/1-methyl-1-cyclopentyl-FA, TFE/1-methyl-1-cyclohexyl-TFMA, TFE/1,2,2,6-tetramethyl-1-cyclohexyl-TFMA and TFE/1,2-dimethyl-1-cyclohexyl-TFMA.

The polymer binders of the present invention may be prepared by a variety of methods known in the literature, such as those disclosed in WO 00/17712 and WO 00/67072. Free-radical polymerization is preferably used. The present binders may be prepared by bulk, solution, suspension or emulsion polymerization techniques known to those skilled in the art using free radical initiators, such as azo compounds or peroxides.

The photoactive components useful in the present invention are typically photoacid or photobase generators, and preferably photoacid generators. The photoacid generators useful in the present invention are any compounds which liberate acid upon exposure to light, typically at a wavelength of about 320 to 420 nanometers, however other wavelengths may be suitable. Suitable photoacid generators include halogenated triazines, onium salts, sulfonated esters and halogenated sulfonyloxy dicarboximides.

Particularly useful halogenated triazines include halomethyl-s-triazines. Suitable halogenated triazines include for example, 2-(1-(3,4-benzodioxolyl))-4,6-bis(trichloromethyl)-1,2,5-triazine, 2-(1-(2,3-benzodioxolyl))-4,6-bis(trichloromethyl)-1,3,5-triazine, 2-(1-(3,4-benzodioxolyl))-4,6-bis(tribromomethyl)-1,3,5-triazine, 2-(1-(2,3-benzodioxolyl))-4,6-bis(tribromomethyl)-1,3,5-triazine, 2-(2-furfylethylidene)-4,6-bis(trichloromethyl)-1,3,5-triazine, 2-(2-(5-methylfuryl)ethylidene)-4,6-bis(trichloromethyl)-1,3,5-triazine, 2-(2-(4-methylfuryl)ethylidene)-4,6-bis(trichloromethyl)-1,3,5-triazine, 2-(2-(3-methylfuryl)ethylidene)-4,6-bis-(trichloromethyl)-1,3,5-triazine, 2-(2-(4,5-dimethylfuryl)ethylidene)-4,6-bis(trichloromethyl)-1,3,5-triazine, 2-(2-(5-methoxyfuryl)ethylidene)-4,6-bis(trichloromethyl)-1,3,5-triazine, 2-(2-(4-methoxyfuryl)ethylidene)-4,6-bis(trichloromethyl)-1,3,5-triazine, 2-(2-(3-methoxyfuryl)ethylidene)-4,6-bis(trichloromethyl)-1,3,5-triazine, 2-(2-(4,5-dimethoxy-furyl)ethylidene)-4,6-bis(trichloromethyl)-1,3,5-triazine, 2-(2-furfylethylidene)-4,6-bis(tribromomethyl)-1,3,5-triazine, 2-(2-(5-methylfuryl)ethylidene)-4,6-bis(tribromomethyl)-1,3,5-triazine, 2-(2-(4-methylfuryl)ethylidene)-4,6-bis(tribromomethyl)-1,3,5-triazine, 2-(2-(3-methylfuryl)ethylidene)-4,6-bis(tribromomethyl)-1,3,5-triazine, 2-(2-(4,5-dimethoxyfuryl)ethylidene)-4,6-bis(tribromomethyl)-1,3,5-triazine, 2-(2-(5-methoxyfuryl)ethylidene)-4,6-bis(tribromomethyl)-1,3,5-triazine, 2-(2-(4-methoxyfuryl)ethylidene)-4,6-bis (tribromomethyl)-1,3,5-triazine, 2-(2-(3-methoxyfuryl)ethylidene)-4,6-bis(tribromomethyl)-1,3,5-triazine, 2-(2-(4,5-dimethoxyfuryl)ethylidene)-4,6-bis(tribromomethyl)-1,3,5-triazine, 2,4,6-tris-(trichloromethyl)-1,3,5-triazine, 2,4,6-tris-(tribromomethyl)-1,3,5-triazine, 2-phenyl-4,6-bis(trichloromethyl)-1,3,5-triazine, 2-phenyl-4,6-bis(tribromomethyl)-1,3,5-triazine, 2-(4-methoxyphenyl)-4,6-bis(trichloromethyl)-1,3,5-triazine, 2-(4-methoxyphenyl)-4,6-bis(tribromomethyl)-1,3,5-triazine, 2-(1-naphthyl)-4,6-bis(trichloromethyl) -1,3,5-triazine, 2-(1-naphthyl)-4,6-bis(tribromomethyl)-1,3,5-triazine, 2-(4-methoxy-1-naphthyl)-4,6-bis(trichloromethyl)-1,3,5-triazine, 2-(4-methoxy-1-naphthyl)-4,6-bis(tribromomethyl)-1,3,5-triazine, 2-(4-chlorophenyl)-4,6-bis(tribromomethyl)-1,3,5-triazine, 2-styryl-4,6-bis(trichloromethyl)-1,3,5-triazine, 2-styryl-4,6-bis(tribromomethyl)-1,3,5-triazine, 2-(4-methoxystyryl)-4,6-bis(trichloromethyl)-1,3,5-triazine, 2-(4-methoxystyryl)-4,6-bis(tribromomethyl)-1,3,5-triazine, 2-(3,4,5-trimethoxystyryl)-4,6-bis(trichloromethyl)-1,3,5-triazine, 2-(3,4,5-trimethoxystyryl)-4,6-bis(tribromomethyl)-1,3,5-triazine, 2-(3-chloro-1-phenyl)-4,6-bis(trichloromethyl)-1,3,5-triazine, 2-(3-chlorophenyl)-4,6-bis(tribromomethyl)-1,3,5-triazine and the like. Other triazine type photoacid generators useful in the present invention are disclosed in U.S. Pat. No. 5,366,846, herein incorporated by reference.

The s-triazine compounds are condensation reaction products of certain methyl-halomethyl-s-triazines and certain aldehydes or aldehyde derivatives. Such s-triazine compounds may be prepared according to the procedures disclosed in U.S. Pat. No. 3,954,475 and Wakabayashi et al., *Bulletin of the Chemical Society of Japan*, 42, 2924–30 (1969).

Onium salts with weakly nucleophilic anions are particularly suitable for use as photoacid generators in the present invention. Examples of such anions are the halogen complex anions of divalent to heptavalent metals or non-metals, for example, antimony, tin, iron, bismuth, aluminum, gallium, indium, titanium, zirconium, scandium, chromium, hafnium, copper, boron, phosphorus and arsenic. Examples of suitable onium salts include, but are not limited to: diaryl-diazonium salts and onium salts of group VA and B, IIA and B and I of the Periodic Table, for example, halonium salts, quaternary ammonium, phosphonium and arsonium salts, aromatic sulfonium salts and sulfoxonium salts or selenium salts. Examples of suitable onium are disclosed in U.S. Pat. Nos. 4,442,197; 4,603,101; and 4,624,912, all incorporated herein by reference.

The sulfonated esters useful as photoacid generators in the present invention include sulfonyloxy ketones. Suitable sulfonated esters include, but are not limited to: benzoin tosylate, t-butylphenyl alpha-(p-toluenesulfonyloxy)-acetate, and t-butyl alpha-(p-toluenesulfonyloxy)-acetate. Such sulfonated esters are disclosed in the *Journal of Photopolymer Science and Technology*, vol. 4, No. 3,337–340 (1991), incorporated herein by reference.

Suitable halogenated sulfonyloxy dicarboximides useful as photoacid generators in the present invention include, but are not limited to: 1(((trifluoromethyl)sulfonyl)oxy)-1H-pyrrole-2,5-dione; N-((perfluorooctanesulfonyl)oxy)-5-norbornene-2,3-dicarboximide; 1-(((trifluoromethyl) sulfonyl)oxy)-2,5-pyrrolidinedione; 3a,4,7,7a-tetrahydro-2-(((trifluoromethyl)sulfonyl)oxy)-4,7-methano-1H-isoindole-1,3 (2H)-dione; 2-(((trifluoromethyl)sulfonyl) oxy)-1H-benz(f)isoindole-1,3(2H)-dione; 3,4-dimethyl-1-(((trifluoromethyl)sulfonyl)oxy)-1H-pyrrole-2,5-dione; 2-(((trifluoromethyl)sulfonyl)oxy)-1H-isoindole-1,3(2H)-dione; 2-(((trifluoromethyl)sulfonyl)oxy)-1H-benz(de) isoquinoline-1,3(2H)-dione; 4,5,6,7-tetrahydro-2-(((trifluoromethyl)sulfonyl)oxy)-1H-isoindole-1,3(2H)-dione; 3a,4,7,7a-tetrahydro-2-(((trifluoromethyl)sulfonyl) oxy)4,7-epoxy-1H-isoindole-1,3(2H)-dione; 2,6-bis-(((trifluoromethyl)sulfonyl)oxy)-benzo(1,2-c:4,5-c') dipyrrole-1,3,5,7(2H,6H)-tetrone; hexahydro-2,6-bis-(((trifluoromethyl)sulfonyl)oxy)-4,9-methano-1H-pyrrolo (4,4-g)isoquinoline-1,3,5,7(2H,3aH,6H)-tetrone; 1,8,8-trimethyl-3-(((trifluoromethyl)sulfonyl)oxy)-3-azabicyclo (3.2.1)octane-2,4-dione; 4,7-dihydro-2—(((trifluoromethyl) sulfonyl)oxy)-4,7-epoxy-1H-isoindole-1,3 (2H)-dione; 3-(1-naphthalenyl)-4-phenyl-1—(((trifluoromethyl) sulfonyl)oxy)-1H-pyrrole-2,5-dione; 3,4-diphenyl-1— (((trifluoromethyl)sulfonyl)oxy)-1H-pyrrole-2,5-dione; 5,5'-(2,2,2-trifluoro-1-(trifluoromethyl)ethylidene)bis(2-(((trifluoromethyl)sulfonyl)oxy)-1H-isoindole-1,3(2H)-dione; tetrahydro-4-(((trifluoromethyl)sulfonyl)oxy)-2,6-methano-2H-oxireno(f) isoindole-3,5(1aH,4H) -dione; 5,5'-oxybis-2-(((trifluoromethyl)sulfonyl)oxy)-1H-isoindole-1,3 (2H)-dione; 4-methyl-2-(((trifluoromethyl)sulfonyl)oxy)-1H-isoindole-1,3(2H)-dione; 3,3,4,4-tetramethyl-1-(((trifluoromethyl)sulfonyl)oxy)-2,5-pyrrolidinedione and mixtures thereof. It is preferred that the halogenated sulfonyloxy dicarboximides comprise one or more of 1(((trifluoromethyl)sulfonyl)oxy)-1H-pyrrole-2,5-dione; N-((perfluorooctanesulfonyl)oxy)-5-norbornene-2,3-dicarboximide; and 1-(((trifluoromethyl)sulfonyl)oxy)-2,5-pyrrolidinedione, and more preferably N-((perfluorooctanesulfonyl)oxy)-5-norbornene-2,3-dicarboximide.

The photoactive components are typically added to photoresist compositions in an amount sufficient to generate a latent image in a coating layer of resist material upon exposure to activating radiation. When the photoactive component is a photoacid generator, the amount is typically in the range of 0.1 to 10 percent by weight, based on the weight of the resin, and preferably 1 to 8 percent by weight. It will be appreciated by those skilled in that art that more than one photoacid generators may be used advantageously in the photoresist compositions of the present invention.

Thus, the present invention provides a method for producing a chemically amplified photoresist including the steps of: a) preparing a binder polymer including as polymerized units a monomer having an electronegative substituent and an ester group, wherein the monomer group includes a leaving group bonded directly to the to the ester group, wherein the leaving group is selected from an optionally substituted noncyclic alkyl moiety having 6 or more carbon atoms, with at least 2 carbon atoms selected from secondary, tertiary and quaternary carbon atoms, and wherein the ester group is directly bonded to a quaternary carbon atom; optionally substituted fenchyl; optionally substituted phenyl; optionally substituted 3,2,0 bridged system; optionally substituted bridged heteroalicyclic group; optionally substituted cycloalkyl group having 3 or 4 ring carbon atoms; and optionally substituted 2,2,1-bridged systems; and b) combining the binder polymer with a photoactive component. In an alternate embodiment, a spacer group is interposed between the leaving group and the ester group.

One or more optional additives may be included in the present photoresist compositions. Such optional additives include, but are not limited to: basic additives, dissolution inhibitors, anti-striation agents, plasticizers, speed enhancers, fillers, dyes, wetting agents or surfactants, leveling agents and the like. Such optional additives will be present in a wide variety of amounts from relatively minor concentrations to, in the case of fillers and dyes, relatively large concentrations, e.g. in amounts of from about 5 to 30 percent by weight, based on the total weight of the composition's dry components.

The optional basic additive can be used in relatively small amount (e.g. 0.1 to 1, 2 or about 3 weight percent of the photoactive component) and can significantly enhance lithographic performance, particularly resolution of a developed resist relief image. In particular, addition of an appropriate basic compound to a resist of the invention can effectively suppress undesired photoacid diffusion into masked areas following an exposure step. Thus, a basic additive is preferred in the present compositions.

Preferred basic additives are amine compounds, including primary, secondary, tertiary and quaternary amines. Amines that are not highly nucleophilic are generally preferred to avoid undesired reaction of the base additive with other resist composition components such as the photoacid generator ("PAG") and/or solvent. For instance, secondary and tertiary amines are generally preferred, particularly secondary and tertiary amines that have sterically large substituents, such as optionally substituted alkyl having at least 3 or 4 carbons e.g. optionally substituted ($C_3$–$C_{20}$) alkyl; optionally substituted alkyl having at least 3 or 4 carbons e.g. optionally substituted ($C_3$–$C_{20}$)alkyl including alicyclic groups such as optionally substituted cyclohexyl, adamantly, isobornyl, etc.; optionally substituted alkenyl having at least 3 or 4 carbons e.g. optionally substituted (C$_3$–C$_{20}$)alkenyl; optionally substituted alkynyl having at least 3 or 4 carbons e.g. (C$_3$–C$_{20}$)alkynyl; optionally substituted carbocyclic ayl such as phenyl; optionally substituted heteroaryl or heroalicyclic such as heteroaryl or heteroalicyclic groups having 1 to 3 separate or fused rings with 1 to 3 heteroatoms (particularly N, O or S) per ring.

Specifically preferred basic additives for use in resist compositions of the invention include DBU (1,8-diazobicyclo[5.4.0]undec-7-ene); DBN (1,5-diazabicyclo[4.3.0]non-5-ene; triisopropanolamine; dibutyl amine preferably branched isomers thereof such as diisobutylamine and ditertbutylamine; tributyl amine and again branched isomers thereof such as ditertbuylamine and tritertbutylamine; and the like.

Other preferred base additives include hydroxy-alkyl secondary and teriarty amines, e.g. secondary and tertiary amines having at least one N-substituent of (C$_2$–C$_{20}$)alkyl having one, two three or more hydroxy moieties, typically one or two hydroxy moieties; alicyclic amines where at least one secondary or tertiary nitrogen is at the junction or bridgehead of a bicyclic or multicyclic compound, such as 1-hydroxyethyl piperidine and 1,4-bishydroxyethyl piperazine. Pyridyl compounds also will be suitable such as di-butyl pyridine and polymers thereof. In general, polymeric basic additives will be suitable, e.g. substituted amines having a molecular weight of up to about 200, 300, 400, 500, 600, 700, 800, 900, 1000, 1100, 1200, 1300, 1400 or 1500.

In a particular resist system, the basic additive should be substantially non-interfering with the photoactive component, i.e. not reactive with a PAG during typical lithographic processing. More specifically, for resists that contain a dicarboxylate imide PAG, preferably secondary or tertiary amines, particularly hindered secondary or tertiary amines, such as moncyclic, bicylic and tricylic amines where nitrogen is a ring member e.g. DBU. Carboxylate additives (e.g. a carboxylate salt such as a ammonium carboxylate salt) are much less preferred for use with a dicarboxylate imide. Carboxylate additives are also less preferred with an iodonium PAG. Hindered secondary and tertiary amines also are preferred for use with an iodonium PAG.

Suitable dissolution inhibitor compounds of resists of the invention are polymeric and/or comprise fluorine substitution. Preferred dissolution inhibitor compounds include those that contain a photoacid-labile group, e.g. a photoacid-labile ester or acetal moiety. Lower molecular weight materials also are generally preferred, e.g. polymers or oligomers having a molecular weight of less than 5,000, more preferably less than about 4,000, 3,000, 2,000, 1,000 or 500. Fluorinated polymers or oligomers are particularly preferred dissolution inhibitor compounds.

The dissolution inhibitor need not be polymeric (i.e. contain repeat units). For example, a variety of non-polymeric compositions are suitable dissolution inhibitors for resists of the invention, particularly where those materials are fluorinated. For instance, suitable are fluorinated compounds having one or more separate or fused rings, including fluorinated steroidal compounds, e.g. a fluorinated cholates and lithochlotates such as cholic acid, deoxycholic acid, lithocholic acid, t-butyl deoxycholate, t-butyl lithocholate, and the like. Such non-polymeric compounds also may have one or more photoacid-labile groups, e.g. a photoacid-labile ester or acetal moiety.

A wide variety of surfactants and leveling agents may be used in the present invention. Suitable surfactants and leveling agents include silicon-containing compounds such as those sold under the SILWET brand, such as SILWET 7604, from Union Carbide (Danbury, Conn.), fluorinated surfactants such as FC430 brand sold by 3M (St. Paul, Minn.), and (meth)acrylate copolymers such as those sold under the MODAFLOW brand by Solutia, Inc (St. Louis, Mo.) and ionic salts such as ammonium sulfonates and quaternary ammonium surfactants. Preferred surfactants are non-ionic. Further preferred surfactants are silicon-containing or fluorine-containing compounds.

The present photoresist compositions may also contain one or more plasticizer materials, which can inhibit or prevent undesired crazing or cracking of a deposited resist layer as well as enhance adhesion of the resist layer to an underlying material. Preferred plasticizers include, e.g., materials having one or more hetero atoms (particularly sulfur or oxygen), and preferably materials having a molecular weight of about 20 to 1000, more typically about 20 to about 50, 60, 70, 80, 90, 150, 200, 250, 300, 400 or 500. Suitable plasticizers include, but are not limited to, adipates, sebacates and phthtalates such as bis(2-butoxyethyl) adipate), bis(2-butoxyethyl)sebacate; bis-(2-butoxyethyl) phthalate, 2-butoxyethyl oleate; diisodecyl adipate, diisodecyl glutarate; and poly(ethylene glycols) such as poly (ethylene glycol)acrylate, poly(ethylene glycol)bis(2-ethyihexanoate), poly(ethylene glycol)dibenzoate, poly (ethylene glycol)dioleate, poly(ethylene glycol)monooleate, tri(ethylene glycol)bis(2-ethylhexanopate), and the like.

The photoresist compositions of the present invention may be readily prepared by those skilled in the art. For example, a photoresist composition of the invention can be prepared by dissolving the components of the photoresist in a suitable solvent. Such suitable solvents include, but are not limited to: ethyl lactate, ethylene glycol monomethyl ether, ethylene glycol monomethyl ether acetate, propylene glycol monomethyl ether, propylene glycol monomethyl ether acetate, 3-ethoxyethyl propionate, 2-heptanone, γ-butyrolactone, and mixtures thereof.

Typically, the solids content of the photoresist composition varies from about 2 to about 35 percent by weight, based on the total weight of the composition, and preferably from 2 to 15 percent by weight. The resin binder and photoacid generators should be present in amounts sufficient to provide a film coating layer and formation of good quality latent and relief images. In general, the present photoresist compositions contain the following components and amounts: photoactive component, e.g. a PAG, is present from 0.5 to 15% of total solids, optional base additive is present from 0 to 8% of total solids and preferably from 0.5 to 8%; optional surfactant/leveling agent is present from 0 to 0.5% of total solids and preferably from 0.02 to 0.5%, optional dissolution inhibitor is present from 0 to 30% of total solids and preferably from 3 to 30%, optional plasticizer is present from 0 to 5% of total solids; and polymer binder as the balance to make up the total amount of solids.

Such photoresist compositions may be applied to a substrate by any known means, such as spinning, dipping, roller coating and the like. When the compositions are applied by spin coating, the solids content of the coating solution can be adjusted to provide a desired film thickness based upon the specific spinning equipment utilized, the viscosity of the solution, the speed of the spinner and the amount of time allowed for spinning.

The present photoresist compositions are usefal in a wide variety of applications for imaging at a wide variety of wavelengths. The present compositions may be applied over silicon wafers or silicon wafers coated with silicon dioxide for the production of microprocessors and other integrated circuit components. Aluminum-aluminum oxide, gallium arsenide, ceramic, quartz, copper, glass and the like are also suitable employed as substrates for the photoresist compsitions of the invention. Optionally, an antireflective composition may be disposed on top of the photoresist material in the case of a top antireflective composition or "TARC", or first disposed on the substrate prior to the application of the present photoresist composition in the case of a bottom antireflective coating or "BARC". The use of such antireflective compositions is well known to those skilled in the art.

Once the photoresist composition is coated on a substrate surface, it is dried by heating to remove any solvent. It is preferably dried until the coating is tack free. Thereafter, it is imaged through a mask in a conventional manner. The exposure is sufficient to effectively activate the photoacid component of the photoresist to produce a patterned image in the resist coating layer, and more specifically, the exposure energy typically ranges from about 1 to 100 mJ/cm$^2$, dependent upon the exposure tool and the components of the photoresist composition.

The photoresist compositions of the present invention may be imaged at a variety of wavelengths such as 248 nm and preferably at sub 200 nm wavelengths, such as 193 nm. The present compositions are particularly suitable for imaging at sub 160 nm wavelength radiation, such as 157 nm and 11–15 nm. However, the photoresist compositions of the present invention may be used at higher wavelengths, such as, but not limited to, visible, e-beam and x-ray.

Following exposure, the film layer of the composition is preferably baked at a temperature typically ranging from 70° to 160° C. Thereafter, the film is developed. The exposed resist film is rendered positive working by employing a polar developer, preferably an aqueous based developer, such as quarternary ammonium hydroxide solutions, such as tetraalkyl ammonium hydroxide, preferably a 0.26 N tetramethylammonium hydroxide; various amine solutions, such as ethylamine, n-propylamine, diethylamine, triethylamine or methyl diethylamine; alcohol amines, such as diethanolamine, triethanolamine; cyclic amines, such as pyrrole, pyridine, and the like. One skilled in the art will appreciate which development procedures should be used for a given system.

Thus, the present invention further provides a method for forming a photoresist relief image including the steps of: a) applying on a substrate a layer of a photoresist composition including a polymer binder and a photoactive component, wherein the polymer binder includes as polymerized units a monomer having an electronegative substituent and an ester group, wherein the monomer group includes a leaving group bonded directly to the to the ester group, wherein the leaving group is selected from an optionally substituted noncyclic alkyl moiety having 6 or more carbon atoms, with at least 2 carbon atoms selected from secondary, tertiary and quaternary carbon atoms, and wherein the ester group is directly bonded to a quaternary carbon atom; optionally substituted fenchyl; optionally substituted phenyl; optionally substituted 3,2,0 bridged system; optionally substituted bridged heteroalicyclic group; optionally substituted cycloalkyl group having 3 or 4 ring carbon atoms; and optionally substituted 2,2,1-bridged systems; and b) exposing and developing the photoresist to provide a relief image. In an alternative embodiment, a spacer is interposed between the leaving group and the ester group.

After development of the photoresist coating, the developed substrate may be selectively processed on those areas bared of resist, for example, by chemically etching or plating or depositing metal on substrate areas bared of resist in accordance with procedures known in the art. For the manufacture of electronic devices, suitable etchants include, but are not limited to, a gas etchant, such as a chlorine- or fluorine-based etchant, such as $Cl_2$ or $CF_4/CHF_3$ etchant applied as a plasma stream. After such processing, the resist may be removed from the processed substrate using any stripping procedures known in the art.

A metallic film is typically deposited or plated onto the patterned substrate layer to fill the etched features. Preferred metallic materials include, but are not limited to: copper, tungsten, gold, silver, aluminum or alloys thereof. The metal is typically deposited onto the patterned substrate layer by techniques well known to those skilled in the art. Such techniques include, but are not limited to: chemical vapor deposition ("CVD"), plasma-enhanced CVD, combustion CVD ("CCVD"), electro and electroless deposition, sputtering, or the like. Optionally, a metallic liner, such as a layer of nickel, tantalum, titanium, tungsten, or chromium, including nitrides or suicides thereof, or other layers such as barrier or adhesion layers, e.g. silicon nitride or titanium nitride, is deposited on the patterned and etched substrate.

Excess metallic material is removed, e.g. by planarizing the metallic film, so that the resulting metallic material is generally level with the patterned substrate layer. Planarization is typically accomplished with chemical/mechanical polishing or selective wet or dry etching. Such planarization methods are well known to those skilled in the art.

Thus, the present invention still further provides a method of manufacturing an electronic device including the steps of: a) disposing on an electronic device substrate a layer of a photoresist composition including a polymer binder and a photoactive component, wherein the polymer binder includes as polymerized units a monomer having an electronegative substituent and an ester group, wherein the monomer group includes a leaving group bonded directly to the to the ester group, wherein the leaving group is selected from an optionally substituted noncyclic alkyl moiety having 6 or more carbon atoms, with at least 2 carbon atoms selected from secondary, tertiary and quaternary carbon atoms, and wherein the ester group is directly bonded to a quaternary carbon atom; optionally substituted fenchyl; optionally substituted phenyl; optionally substituted 3,2,0 bridged system; optionally substituted bridged heteroalicyclic group; optionally substituted cycloalkyl group having 3 or 4 ring carbon atoms; and optionally substituted 2,2,1-bridged systems; b) exposing and developing the photoresist to provide a relief image; c) etching features in the substrate; and d) removing the photoresist composition. In an alternative embodiment, a spacer is interposed between the leaving group and the ester group.

Even further provided by the present invention is an electronic device substrate including a coating including a layer of a photoresist composition including a polymer binder and a photoactive component, wherein the polymer binder includes as polymerized units a monomer having an electronegative substituent and an ester group, wherein the monomer group includes a leaving group bonded directly to the to the ester group, wherein the leaving group is selected from a) an optionally substituted noncyclic alkyl moiety having 6 or more carbon atoms, with at least 2 carbon atoms selected from secondary, tertiary and quaternary carbon atoms, and wherein the ester group is directly bonded to a quaternary carbon atom; b) optionally substituted fenchyl; c) optionally substituted phenyl; d) optionally substituted 3,2,0 bridged system; e) optionally substituted bridged heteroalicyclic group; f) optionally substituted cycloalkyl group having 3 or 4 ring carbon atoms; and g) optionally substituted 2,2,1-bridged systems. In yet another embodiment, a spacer is interposed between the leaving group and the ester group.

What is claimed is:

1. A photoresist composition comprising a polymer binder and a photoactive component, wherein the polymer binder comprises as polymerized units a monomer having an electronegative substituent and an ester group, wherein the monomer group comprises a leaving group bonded directly to the to the ester group, wherein the leaving group is selected from a) an optionally substituted noncyclic alkyl moiety having 6 or more carbon atoms, with at least 2 carbon atoms selected from secondary, tertiary and quaternary carbon atoms, and wherein the ester group is directly bonded to a quaternary carbon atom; b) optionally substituted fenchyl; c) optionally substituted phenyl; d) optionally substituted 3,2,0 bridged system; e) optionally substituted bridged heteroalicyclic group; f) optionally substituted cycloalkyl group having 3 or 4 ring carbon atoms; and g) optionally substituted 2,2,1-bridged systems.

2. The photoresist composition of claim 1 wherein the electronegative substituent comprises one or more fluorine atoms.

3. The photoresist composition of claim 1 wherein the electronegative-substituent is fluorine or fluoro($C_1$–$C_4$) alkyl.

4. The photoresist composition of claim 3 wherein the electronegative substituent is selected from the group consisting of fluoromethyl, difluoromethyl, trifluoromethyl, fluoroethyl, difluoroethyl, trifluoroethyl and perfluoroethyl.

5. The photoresist composition of claim 1 wherein the polymer binder further comprises as polymerized units one or more cyclic olefin monomers.

6. The photoresist composition of claim 5 wherein the cyclic olefin monomers are ($C_5$–$C_{10}$)cyclic olefins.

7. The photoresist composition of claim 1 wherein the polymer binder comprises one or more of the following units

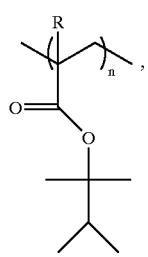

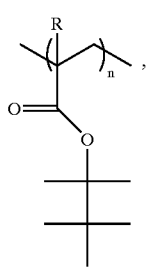

-continued

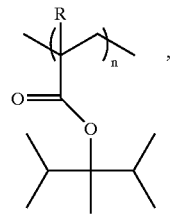

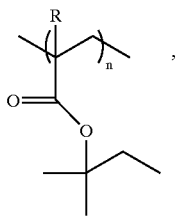

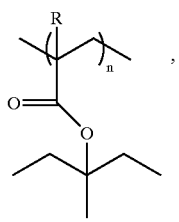

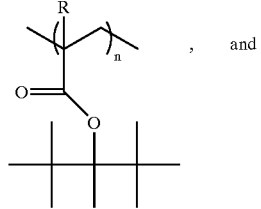

and

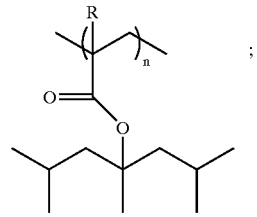

;

wherein R is all electronegative substituent and n=2–100,000.

8. The photoresist composition of claim 1 wherein the photoactive component is a photoacid generator selected from the group consisting of halogenated triazines, onium salts, sulfonated esters and halogenated sulfonyloxy dicarboximides.

9. The photoresist composition of claim 1 further comprising one or more of basic additives, dissolution inhibitors, anti-striation agents, plasticizers, speed enhancers, fillers, dyes or wetting agents.

10. A method for producing a chemically amplified photoresist comprising the steps of: a) preparing a binder polymer comprising as polymerized units a monomer having an electronegative substituent and an ester group, wherein the monomer group comprises a leaving group bonded directly to the to the ester group, wherein the leaving group is selected from an optionally substituted noncyclic alkyl moiety having 6 or more carbon atoms, with at least 2 carbon atoms selected from secondary, tertiary and quaternary carbon atoms, and wherein the ester group is directly bonded to a quaternary carbon atom; optionally substituted fenchyl; optionally substituted phenyl; optionally substituted 3,2,0 bridged system; optionally substituted bridged heteroalicyclic group; optionally substituted cycloalkyl group having 3 or 4 ring carbon atoms; and optionally substituted 2,2,1-bridged systems; and b) combining the binder polymer with a photoactive component.

11. The method of claim 10 wherein the photoactive component is a photoacid generator selected from the group consisting of halogenated triazines, onium salts, sulfonated esters and halogenated sulfonyloxy dicarboximides.

12. The method of claim 10 wherein the electronegative substituent comprises one or more fluorine atoms.

13. The method of claim 10 wherein the electronegative substituent is fluorine or fluoro($C_1$–$C_4$)alkyl.

14. The method of claim 10 wherein the polymer binder further comprises as polymerized units one or more cyclic olefin monomers.

15. The method of claim 10 wherein the polymer binder comprises one or more of the following units

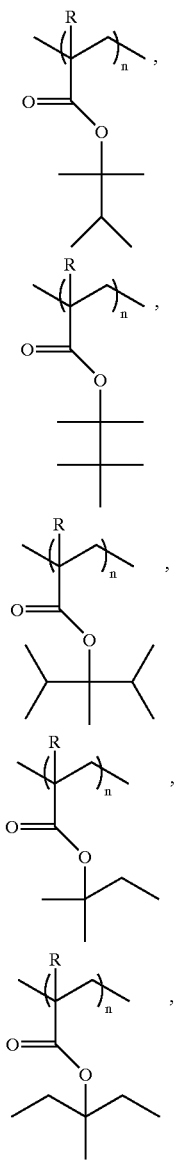

-continued

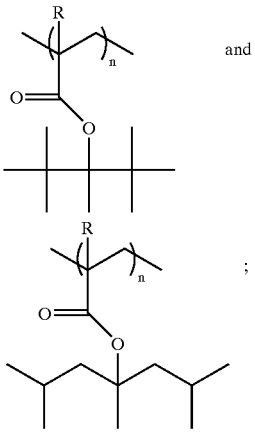

wherein R is an electronegative substituent and n=2–100,000.

16. The method of claim 10 further comprising a spacer interposed between the leaving group and the ester group.

17. A method for forming a photoresist relief image comprising the steps of: a) applying on a substrate a layer of a photoresist composition comprising a polymer binder and a photoactive component, wherein the polymer binder includes as polymerized units a monomer having an electronegative substituent and an ester group, wherein the monomer group comprises a leaving group bonded directly to the to the ester group, wherein the leaving group is selected from an optionally substituted noncyclic alkyl moiety having 6 or more carbon atoms, with at least 2 carbon atoms selected from secondary, tertiary and quaternary carbon atoms, and wherein the ester group is directly bonded to a quaternary carbon atom; optionally substituted fenchyl; optionally substituted phenyl; optionally substituted 3,2,0 bridged system; optionally substituted bridged heteroalicyclic group; optionally substituted cycloalkyl group having 3 or 4 ring carbon atoms; and optionally substituted 2,2,1-bridged systems; and b) exposing and developing the photoresist to provide a relief image.

18. An electronic device substrate comprising a coating comprising a layer of a photoresist composition including a polymer binder and a photoactive component, wherein the polymer binder comprises as polymerized units a monomer having an electronegative substituent and an ester group, wherein the monomer group comprises a leaving group bonded directly to the to the ester group, wherein the leaving group is selected from a) an optionally substituted noncyclic alkyl moiety having 6 or more carbon atoms, with at least 2 carbon atoms selected from secondary, tertiary and quaternary carbon atoms, and wherein the ester group is directly bonded to a quaternary carbon atom; b) optionally substituted fenchyl; c) optionally substituted phenyl; d) optionally substituted 3,2,0 bridged system; e) optionally substituted bridged heteroalicyclic group; f) optionally substituted cycloalkyl group having 3 or 4 ring carbon atoms; and g) optionally substituted 2,2,1-bridged systems.

19. A method of manufacturing an electronic device comprising the steps of: a) disposing on an electronic device substrate a layer of a photoresist composition comprising a polymer binder and a photoactive component, wherein the polymer binder comprises as polymerized units a monomer having an electronegative substituent and an ester group, wherein the monomer group comprises a leaving group bonded directly to the to the ester group, wherein the leaving group is selected from an optionally substituted noncyclic alkyl moiety having 6 or more carbon atoms, with at least 2 carbon atoms selected from secondary, tertiary and quaternary carbon atoms, and wherein the ester group is directly bonded to a quaternary carbon atom; optionally substituted fenchyl; optionally substituted phenyl; optionally substituted 3,2,0 bridged system; optionally substituted bridged heteroalicyclic group; optionally substituted cycloalkyl group having 3 or 4 ring carbon atoms; and optionally substituted 2,2,1bridged systems; b) exposing and developing the photoresist to provide a relief image; c) etching features in the substrate; and d) removing the photoresist composition.

20. A photoresist composition comprising a polymer binder and a photoactive component, wherein the polymer binder comprises as polymerized units a monomer having an electronegative substituent and an ester group, wherein a spacer is interposed between the ester group and a leaving group, wherein the leaving group is selected from a) an optionally substituted noncyclic alkyl moiety having 6 or more carbon atoms, with at least 2 carbon atoms selected from secondary, tertiary and quaternary carbon atoms, and wherein the ester group is directly bonded to a quaternary carbon atom; b) optionally substituted fenchyl; c) optionally substituted phenyl; d) optionally substituted 3,2,0 bridged system; e) optionally substituted bridged heteroalicyclic group; f) optionally substituted cycloalkyl group having 3 or 4 ring carbon atoms; and g) optionally substituted 2,2,1-bridged systems.

21. A photoresist composition comprising a polymer binder and a photoactive component, wherein the polymer binder comprises 1) one or more polymerized cyclic olefin monomers and 2) as polymerized units a monomer having an ester group and an electronegative substituent, wherein the monomer group having an electronegative substituent comprises a leaving group bonded directly to the to the ester group, wherein the leaving group is selected from a) an optionally substituted noncyclic alkyl moiety having 6 or more carbon atoms, with at least 2 carbon atoms selected from secondary, tertiary and quaternary carbon atoms, an wherein the ester group is directly bonded to a quaternary carbon atom; b) optionally substituted fenchyl; c) optionally substituted phenyl; d) optionally substituted 3,2,0 bridged system; e) optionally substituted bridged heteroalicyclic group; f) optionally substituted cycloalkyl group having 3 or 4 ring carbon atoms; and g) optionally substituted 2,2,1-bridged systems.

22. The photoresist composition of claim 21 wherein the cyclic olefin monomers are ($C_5$–$C_{10}$) cyclic monomers.

23. A photoresist composition comprising a polymer binder and a photoacid generator that is a halogenated triazine, onium salt, sulfonated ester a halogenated sulfonyloxy dicarboximide, wherein the polymer binder comprises 1) one or more polymerized cyclic olefin monomers and 2) as polymerized units a monomer having an ester group and an electronegative substituent, wherein the monomer group having an electronegative substituent comprises a leaving group bonded directly to the to the ester group, wherein the leaving group is selected from a) an optionally substituted noncyclic alkyl moiety having 6 or more carbon atoms, with at least 2 carbon atoms selected from secondaxy, tertiary and quaternary carbon atoms, and wherein the ester group is directly bonded to a quaternary carbon atom; b) optionally substituted fenchyl; c) optionally substituted phenyl; d) optionally substituted 3,2,0 bridged system; e) optionally substituted bridged heteroalicyclic group; f) optionally substituted cycloalkyl group having 3 or 4 ring carbon atoms; and g) optionally substituted 2,2,1-bridged systems.

24. A photoresist composition comprising a) a polymer binder, b) a photoactive component, and c) one or more of a basic additive, dissolution inhibitor, anti-striation agent, plasticizer, speed enhancer, filler, dye or wetting agent, wherein the polymer binder comprises 1) one or more polymerized cyclic olefin monomers and 2) as polymerized units a monomer having an ester group and electronegative substituent, wherein the monomer group having an electronegative substituent comprises a leaving group bonded directly to the to the ester group, wherein the leaving group is selected from a) an optionally substituted noncyclic alkyl moiety having 6 or more carbon atoms, with at least 2 carbon atoms selected from secondary, tertiary and quaternary carbon atoms, an wherein the ester group is directly bonded to a quaternary carbon atom; b) optionally substituted fenchyl; c) optionally substituted phenyl; d) optionally substituted 3,2,0 bridged system; e) optionally substituted bridged heteroalicyclic group; f) optionally substituted cycloallcyl 4group having 3 or 4 ring carbon atoms; and g) optionally substituted 2,2,1-bridged systems.

* * * * *